(12) United States Patent
Stark

(10) Patent No.: US 10,312,274 B1
(45) Date of Patent: Jun. 4, 2019

(54) SINGLE PHOTON AVALANCHE DIODE (SPAD) WITH VARIABLE QUENCH RESISTOR

(71) Applicant: STMicroelectronics (Research & Development) Limited, Marlow, Buckinghamshire (GB)

(72) Inventor: Laurence Stark, Edinburgh (GB)

(73) Assignee: STMicroelectronics (Research & Development) Limited, Marlow (GB)

( * ) Notice: Subject to any disclaimer, the term of this patent is extended or adjusted under 35 U.S.C. 154(b) by 0 days.

(21) Appl. No.: 15/881,916

(22) Filed: Jan. 29, 2018

(51) Int. Cl.
| | |
|---|---|
| *H01L 31/107* | (2006.01) |
| *H01L 27/144* | (2006.01) |
| *H01L 29/8605* | (2006.01) |
| *H01L 31/02* | (2006.01) |
| *H01L 27/146* | (2006.01) |

(52) U.S. Cl.
CPC ...... *H01L 27/1443* (2013.01); *H01L 29/8605* (2013.01); *H01L 31/02005* (2013.01); *H01L 31/02027* (2013.01); *H01L 31/107* (2013.01); *H01L 27/14609* (2013.01)

(58) Field of Classification Search
CPC .......... H01L 27/1443; H01L 31/02027; H01L 31/107; H01L 31/1075; H01L 28/20–28/26; G01T 1/248; G01J 2001/442; G01J 2001/4466
See application file for complete search history.

(56) References Cited

U.S. PATENT DOCUMENTS

| | | | |
|---|---|---|---|
| 8,766,164 B2 | 7/2014 | Sanfilippo et al. | |
| 2012/0132636 A1 | 5/2012 | Moore | |
| 2014/0191115 A1 | 7/2014 | Webster et al. | |
| 2014/0217264 A1* | 8/2014 | Shepard | G01N 21/6458 250/208.1 |
| 2018/0180805 A1* | 6/2018 | Huang | G02B 6/122 |
| 2018/0374978 A1* | 12/2018 | Piemonte | H01L 31/107 |

OTHER PUBLICATIONS

"Avalanche photodiodes and quenching circuits for single-photon detection" S. Cova, M. Ghioni, A. Lacaita, C. Samori, and F. Zappa, in Applied Optics vol. 35 Issue 12 pp. 1956-1976 (1996) (Year: 1996).*

* cited by examiner

*Primary Examiner* — Eric A. Ward

(57) ABSTRACT

A photosensitive diode has an anode terminal and a cathode terminal. A passive quench resistance circuit includes a resistor with a variable resistance that is controlled by a control signal. The resistor is electrically connected to the cathode terminal. The resistor of the passive quench resistance circuit is formed by a first semiconductor region. The control signal is applied to a control gate of the passive quench resistance circuit. The control gate is formed by a second semiconductor region that is insulated from the first semiconductor region and extends parallel to the first semiconductor region. The voltage of the control signal applied to the control gate controls the variable resistance.

29 Claims, 5 Drawing Sheets

SINGLE PHOTON AVALANCHE DIODE (SPAD) WITH VARIABLE QUENCH RESISTOR

TECHNICAL FIELD

The present invention relates to the passive quenching of a single photon avalanche diode (SPAD) and, in particular, to the use of a variable quench resistor coupled to a SPAD.

BACKGROUND

Reference is made to FIG. 1 showing a circuit diagram of single photon avalanche diode (SPAD) circuit 10. The circuit 10 includes a photosensitive diode 12 having an anode terminal connected to a substrate voltage node ($V_{SUB}$) and a cathode terminal connected to an intermediate node 14. A quench resistor $R_Q$ has a first terminal connected to the intermediate node and a second terminal connected to a breakdown voltage node ($V_{BD}$). Thus, the photosensitive diode 12 and quench resistor $R_Q$ are coupled in series between the substrate voltage node ($V_{SUB}$) and the breakdown voltage node ($V_{BD}$). A DC blocking capacitor C has a first plate connected to the intermediate node 14 and a second plate connected to the input of a logic circuit 16. The capacitor C functions to couple the AC signal present at the intermediate node 14 to the input of the logic circuit 16. The logic circuit 16 may, for example, comprise a CMOS logical NOT gate. The input of the logic circuit 16 may be separately biased by a circuit (not shown) at a voltage level that is compatible with CMOS circuitry. An output of the logic circuit 16 generates the SPAD circuit output signal $V_{OUT}$ at CMOS logic levels.

The voltage levels at the substrate voltage node ($V_{SUB}$) and the breakdown voltage node ($V_{BD}$) are selected so as to apply a reverse bias voltage across the photosensitive diode 12 that exceeds the breakdown voltage of the photosensitive diode 12. In response to absorption of an incident photon by the photosensitive diode 12, an electron-hole pair is generated and this triggers an ionization process that causes an avalanche of multiplication of carriers and the subsequent generation of an avalanche current.

In order to detect subsequent photons, it is necessary to quench the generated avalanche current. This quenching operation is performed by the quench resistor $R_Q$. The quench resistor $R_Q$ is a passive circuit. In the absence of an incident photon, the quench resistor $R_Q$ has no effect on the effective reverse bias voltage across the photosensitive diode 12. However, the avalanche current that is generated in response to absorption of the incident photon flows in the quench resistor $R_Q$ and results in an exponential reduction of the amplitude of the effective reverse bias voltage across the photosensitive diode 12. The avalanche is quenched when the voltage drop across the quench resistor $R_Q$ causes the effective reverse bias voltage across the photosensitive diode 12 to fall below the breakdown voltage of the photosensitive diode 12.

The quench resistor $R_Q$ must be tolerant of high voltages (for example, voltages in excess of 14V). As a result, it is common for the quench resistor $R_Q$ to be implemented as a polysilicon resistor in an integrated circuit. A drawback of this resistor configuration is that the effective resistance of such a polysilicon resistor cannot be adjusted. There are a number of applications, however, where access to a variable resistance value for the quench resistor $R_Q$ would be advantageous.

SUMMARY

In an embodiment, an integrated circuit comprises: a photosensitive diode having an anode terminal and a cathode terminal; and a passive quench resistor having a first terminal connected to the cathode terminal and second terminal connected to a supply node configured to receive a supply voltage sufficient to reverse bias the photosensitive diode to function as a single photon avalanche diode (SPAD). The passive quench resistor is formed by: a first semiconductor region of a semiconductor substrate that is relatively lightly doped with a first conductivity type dopant; a first well region at an upper surface of the semiconductor substrate within the first semiconductor region that is relatively heavily doped with the first conductivity type dopant to form the first terminal of the passive quench resistor; and a second well region at the upper surface of the semiconductor substrate within the first semiconductor region that is relatively heavily doped with the first conductivity type dopant to form the second terminal of the passive quench resistor. The circuit further comprises a control gate configured to receive a control signal having a voltage which controls a resistivity of the passive quench resistor, wherein the control gate is formed by: a second semiconductor region of the semiconductor substrate that is relatively lightly doped with the first conductivity type dopant, said second semiconductor region insulated from the first semiconductor region and extending parallel to the first semiconductor region; and a third well region at an upper surface of the semiconductor substrate within the second semiconductor region that is relatively heavily doped with the first conductivity type dopant to form the control gate.

In an embodiment, an integrated circuit comprises: a semiconductor substrate that is relatively lightly doped with a first conductivity type dopant; an insulating wall that delimits, within the semiconductor substrate, a first semiconductor region, a second semiconductor region and a third semiconductor region, wherein the first, second and third semiconductor regions are insulated from each other by said insulating wall; a first well within the first semiconductor region that is doped with a second conductivity type dopant and configured to form a first photosensitive diode; a second well at an upper surface of the semiconductor substrate within the second semiconductor region that is relatively heavily doped with the first conductivity type dopant to form a first terminal; a third well at an upper surface of the semiconductor substrate within the second semiconductor region that is relatively heavily doped with the first conductivity type dopant to form a second terminal; wherein the third well is separated from the second well by a portion of the second semiconductor region to form a first quench resistor that is electrically connected to the first photosensitive diode through one of the first and second terminals; and a fourth well at an upper surface of the semiconductor substrate within the third semiconductor region that is relatively heavily doped with the first conductivity type dopant to form a first gate terminal configured to modulate a resistance of the first quench resistor.

In an embodiment, an integrated circuit comprises: a photosensitive diode having an anode terminal and a cathode terminal; and a passive quench resistance circuit having a variable resistance controlled by a control signal. The passive quench resistance circuit comprises: a first semiconductor region of a semiconductor substrate that is doped with a first conductivity type dopant at a first concentration level and including a first resistor terminal and a second resistor terminal, the first and second resistor terminals separated from each other by a portion of the first semiconductor region forming a resistor; wherein one of the first and second resistor terminals is electrically connected to the cathode terminal of the photosensitive diode; and a second semiconductor region of the semiconductor substrate that is doped with the first conductivity type dopant at a second concentration level higher than the first concentration level, said second semiconductor region insulated from the first semiconductor region and extending parallel to the first semiconductor region to form a control gate configured to receive said control signal with a voltage that controls said variable resistance.

In an embodiment, an integrated circuit comprises: a photosensitive diode having an anode terminal and a cathode terminal; and a passive quench resistance circuit having a variable resistance controlled by a control signal; wherein said passive quench resistance circuit comprises: a semiconductor region of a semiconductor substrate that is doped with a first conductivity type dopant at a first concentration level and including a first resistor terminal and a second resistor terminal, the first and second resistor terminals separated from each other by a portion of the first semiconductor region forming a resistor; wherein one of the first and second resistor terminals is electrically connected to the cathode terminal of the photosensitive diode; and a conductive deep trench isolation structure insulated from the first semiconductor region and extending parallel to the first semiconductor region to form a control gate configured to receive said control signal with a voltage that controls said variable resistance.

BRIEF DESCRIPTION OF THE DRAWINGS

The accompanying drawings are included to provide a further understanding of the invention and are incorporated in and constitute a part of this specification, illustrate embodiments of the invention and together with the description serve to explain the principles of the invention.

In the drawings.

DETAILED DESCRIPTION

Figure 2:
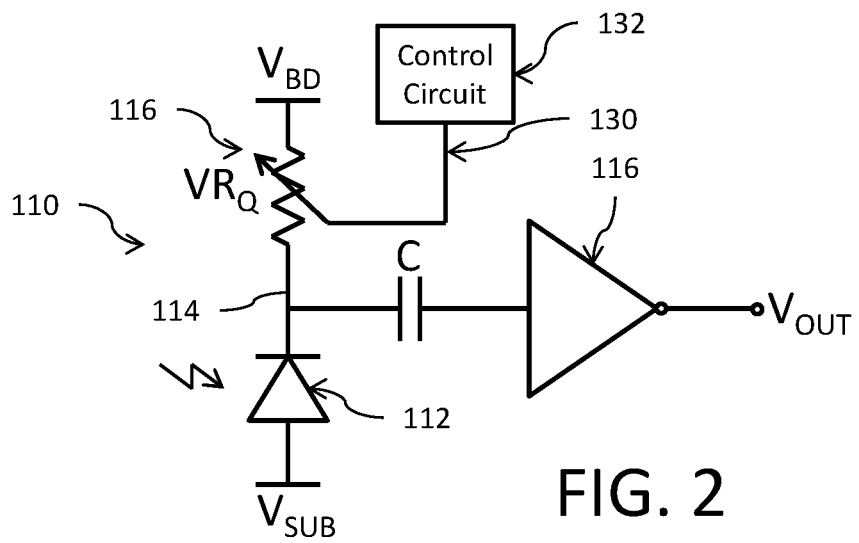
FIG. 2 is a circuit diagram of a SPAD circuit.

Reference is now made to FIG. 2 showing a circuit diagram of single photon avalanche diode (SPAD) circuit 110. The circuit 110 includes a photosensitive diode 112 having an anode terminal connected to a substrate voltage node ($V_{SUB}$) and a cathode terminal connected to an intermediate node 114. A variable quench resistance circuit 116 includes a variable quench resistor $VR_Q$ having a first terminal connected to the intermediate node and a second terminal connected to a breakdown voltage node ($V_{BD}$). Thus, the photosensitive diode 112 and variable quench resistor $VR_Q$ are coupled in series between the substrate voltage node ($V_{SUB}$) and the breakdown voltage node ($V_{BD}$). A DC blocking capacitor C has a first plate connected to the intermediate node 114 and a second plate connected to the input of a logic circuit 116. The capacitor C functions to couple the AC signal present at the intermediate node 114 to the input of the logic circuit 116. The logic circuit 116 may, for example, comprise a CMOS logical NOT gate. The input of the logic circuit 116 may be separately biased by a circuit (not shown) at a voltage level that is compatible with CMOS circuitry. An output of the logic circuit 116 generates the SPAD circuit output signal $V_{OUT}$ at CMOS logic levels.

The voltage levels at the substrate voltage node ($V_{SUB}$) and the breakdown voltage node ($V_{BD}$) are selected so as to apply a reverse bias voltage across the photosensitive diode 112 that exceeds the breakdown voltage of the photosensitive diode 112. In response to absorption of an incident photon by the photosensitive diode 112, an electron-hole pair is generated and this triggers an ionization process that causes an avalanche of multiplication of carriers and the subsequent generation of an avalanche current.

In order to detect subsequent photons, it is necessary to quench the generated avalanche current. This quenching operation is performed by the variable quench resistor $VR_Q$. The variable quench resistor $VR_Q$ is a passive circuit. In the absence of an incident photon, the variable quench resistor $VR_Q$ has no effect on the effective reverse bias voltage across the photosensitive diode 112. However, the avalanche current that is generated in response to absorption of the incident photon flows in the variable quench resistor $VR_Q$ and results in an exponential reduction of the amplitude of the effective reverse bias voltage across the photosensitive diode 112. The avalanche is quenched when the voltage drop across the variable quench resistor $VR_Q$ causes the effective reverse bias voltage across the photosensitive diode 112 to fall below the breakdown voltage of the photosensitive diode 112.

Figure 1:
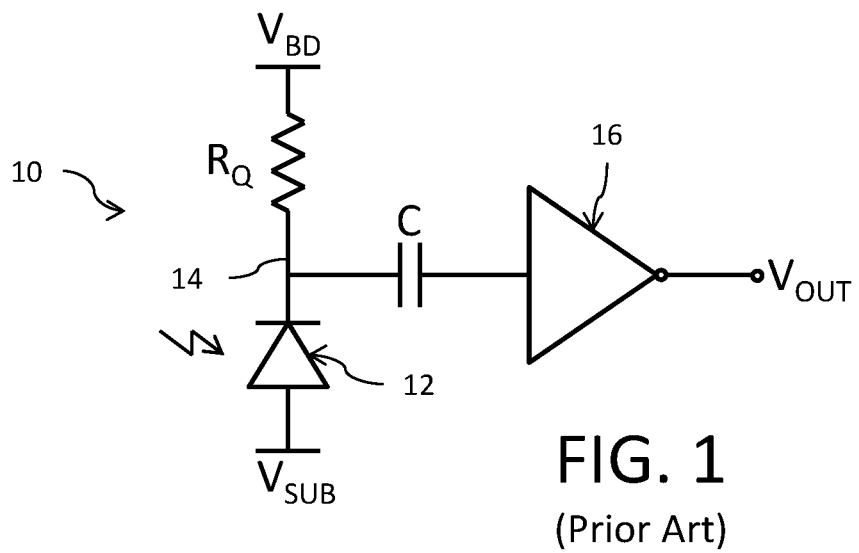
FIG. 1 is a circuit diagram of a conventional single photon avalanche diode (SPAD) circuit.

Unlike the passive fixed resistance of the quench resistor $R_Q$ in FIG. 1, the variable quench resistor $VR_Q$ has resistance that is variable and has a value that is controlled by a signal 130 generated by a control circuit 132. In an embodiment, the resistance of the variable quench resistor $VR_Q$ may vary in response to change in the signal 130 over a range of between 30 KΩ and 50 KΩ, and more generally over a range of between 20 KΩ and 60 KΩ.

Figure 3:
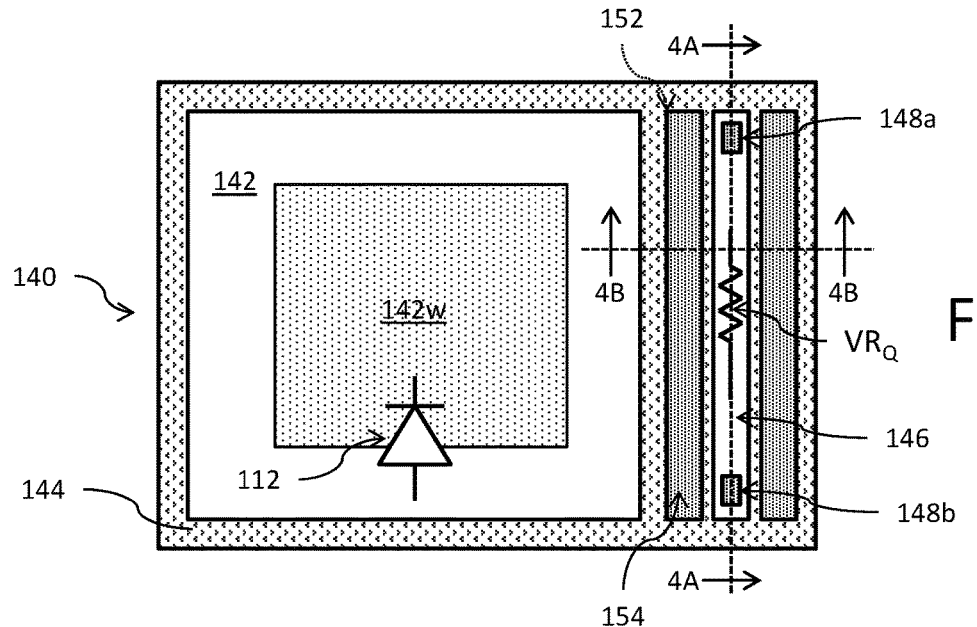
FIG. 3 is a plan view of an example layout of the variable quench resistor and the photosensitive diode to form a pixel cell.

Reference is now made to FIG. 3 showing a plan view of an example layout of a variable quench resistance circuit (which includes the variable quench resistor $VR_Q$) and the photosensitive diode 112 to form a pixel cell 140 (not drawn to scale). The pixel cell 140 may be replicated numerous times in a tile-like fashion to form a sensor array that includes a plurality of pixel cells arranged in an array that includes plural rows and plural columns. Each pixel cell 140 includes a region 142 of semiconductor material of a semiconductor substrate that is surrounded by an insulating wall 144. The region 142 includes the necessary structures (for example, doped regions) to form the anode and cathode of the photosensitive diode 112. Specific details of all structures related to the photosensitive diode 112 are not provided as such details are well known to those skilled in the art. As a simplified example, however, the region 142 may, for example, comprise a portion of a semiconductor substrate that is doped with a first conductivity type (for example, p-type) dopant forming the anode. A well region 142w is located within the region 142 that is doped with a second conductivity type (for example, n-type) dopant to form the cathode.

Figure 4A:
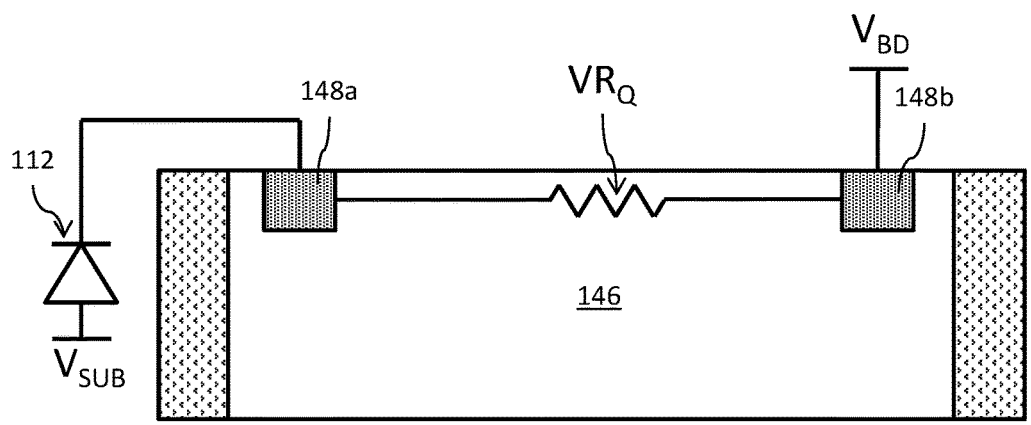
FIGS. 4A-4B are cross-sectional views.
Figure 4B:
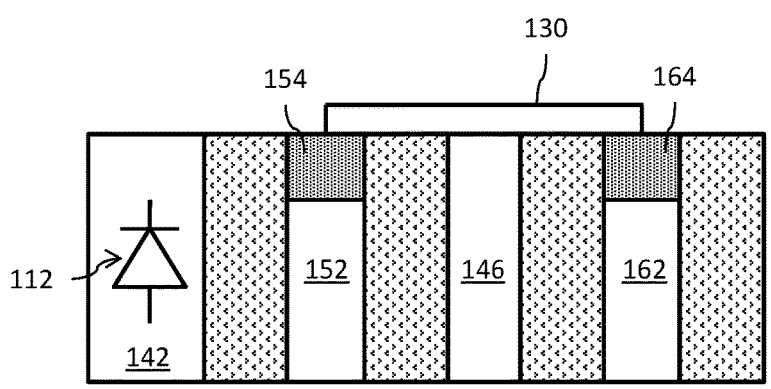

Additional reference is now made to FIGS. 4A and 4B which are cross-sectional views of a portion of the pixel cell 140 (not drawn to scale) showing details of the variable quench resistance circuit which includes the structure for variable quench resistor $VR_Q$ and the structure for a control gate to control a value of the resistance of that resistor.

The pixel cell 140 further includes a region 146 of semiconductor material that is surrounded by the insulating wall 144. The region 146 may, for example, comprise a portion of the semiconductor substrate that is relatively lightly doped with the first conductivity type (p-type) dopant. The region 146 is rectangular in shape, with the cross-sectional view of FIG. 4A taken along a length of the region 146 and the cross-sectional view of FIG. 4B taken along a width (which is smaller than the length) of the region 146. At a first end of the rectangular region 146, a well region 148a is located at the upper surface of the substrate that provides a contact to a first terminal of the variable quench resistor $VR_Q$. This first terminal may be connected to the cathode of the photosensitive diode 112. At a second end of the rectangular region 146, opposite the first end, a well region 148b is located at the upper surface of the substrate that provides a contact to a second terminal of the variable quench resistor $VR_Q$. This second terminal may be connected to the breakdown voltage node ($V_{BD}$). The well regions 148a and 148b are separated from each other by a portion of the region 146 which forms the variable resistive region of the variable quench resistor $VR_Q$ part of the variable quench resistance circuit. The well regions 148a and 148b are relatively heavily doped with the first conductivity type (p-type) dopant. As an example, the relatively lightly doped region 146 may have a dopant concentration on the order of $10^{16}$ to $10^{17}$ at/cm$^3$ while the relatively heavily doped well regions 148a and 148b may have a dopant concentration on the order of $10^{19}$ to $10^{20}$ at/cm$^3$.

The pixel cell 140 further includes a region 152 of semiconductor material that is surrounded by the insulating wall 144. The region 152 may, for example, comprise a portion of the semiconductor substrate that is relatively lightly doped with the first conductivity type (p-type) dopant. The region 152 is rectangular in shape and extends parallel to the region 146 and may, for example, have a same length as the region 146. The region 152 is positioned between the region 146 and the region 142. A well region 154 is located at the upper surface of the substrate within the region 152. In an embodiment, the well region 154 is rectangular in shape and has length and width dimensions matching the length and width dimensions of the region 152. The well region 154 forms a control gate part of the variable quench resistance circuit having a terminal that is connected to receive the control signal 130. As an example, the relatively lightly doped region 152 may have a dopant concentration on the order of $10^{16}$ to $10^{17}$ at/cm$^3$ while the relatively heavily doped well region 154 may have a dopant concentration on the order of $10^{19}$ to $10^{20}$ at/cm$^3$.

The pixel cell 140 further includes a region 162 of semiconductor material that is surrounded by the insulating wall 144. The region 162 may, for example, comprise a portion of the semiconductor substrate that is relatively lightly doped with the first conductivity type (p-type) dopant. The region 162 is rectangular in shape and extends parallel to the region 146 and may, for example, have a same length as the region 146. The region 162 is positioned on an opposite side of the region 146 with respect to the region 152. A well region 164 is located at the upper surface of the substrate within the region 162. In an embodiment, the well region 164 is rectangular in shape and has length and width dimensions matching the length and width dimensions of the region 162. The well region 164 forms an additional control gate part of the variable quench resistance circuit having a terminal that is also connected to receive the control signal 130. As an example, the relatively lightly doped region 162 may have a dopant concentration on the order of $10^{16}$ to $10^{17}$ at/cm$^3$ while the relatively heavily doped well region 164 may have a dopant concentration on the order of $10^{19}$ to $10^{20}$ at/cm$^3$.

The well regions 148a, 148b, 154 and 164 may all have a same or similar depth which is only a small fraction of the thickness of the semiconductor substrate.

The insulating wall 144 may, for example, comprise a deep trench isolation (DTI) structure as known to those skilled in the art and have a depth that is equal to the thickness of the semiconductor substrate as shown in FIGS. 4A-4B.

As noted above, the well regions 148a and 148b form terminal contacts for the variable quench resistor $VR_Q$, and those well regions 148a and 148b are separated from each other by a portion of the region 146 which forms the variable resistive region of the variable quench resistor $VR_Q$. Current flow between the well regions 148a and 148b in a direction generally parallel to the upper surface of the substrate is controlled by the voltage of the control signal 130 applied to the well regions 154 and/or 164 which function as a control gate. In this configuration, the portion of the region 146 between the well regions 148a and 148b forms a channel whose conductivity is modulated by the control signal 130 voltage (Vgate) applied to the gate well regions 154 and/or 164.

Figure 5:
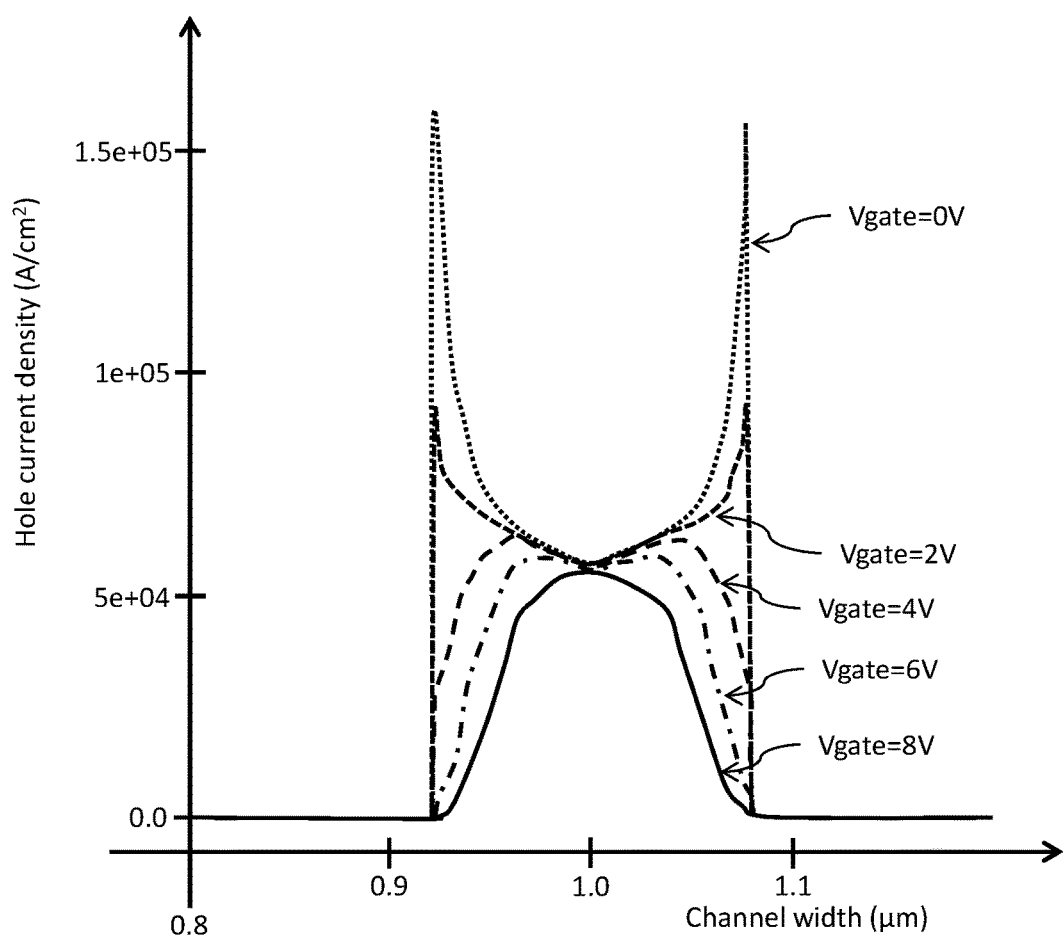
FIGS. 5-6 are graphs illustrating operation of the variable quench resistor.

FIG. 5 is a graph showing the modulation of the channel width for the portion of the region 146 which forms the variable resistive region based on hole current density as a function of control signal 130 voltage (Vgate). FIG. 5 is intended to show how the control voltage on the resistor modulates the current density in the channel. The graph shows the hole current density through a transverse cut of the resistor channel. The DTI walls of the resistor channel are at ~0.92 µm and ~1.08 µm. The resistor channel is the region between these two points and is approximately 0.16 µm wide. Increasing the gate voltage (Vgate) depletes the holes near the DTI sidewalls and reduces the current density in those regions—this increases the resistance of the channel.

Figure 6:
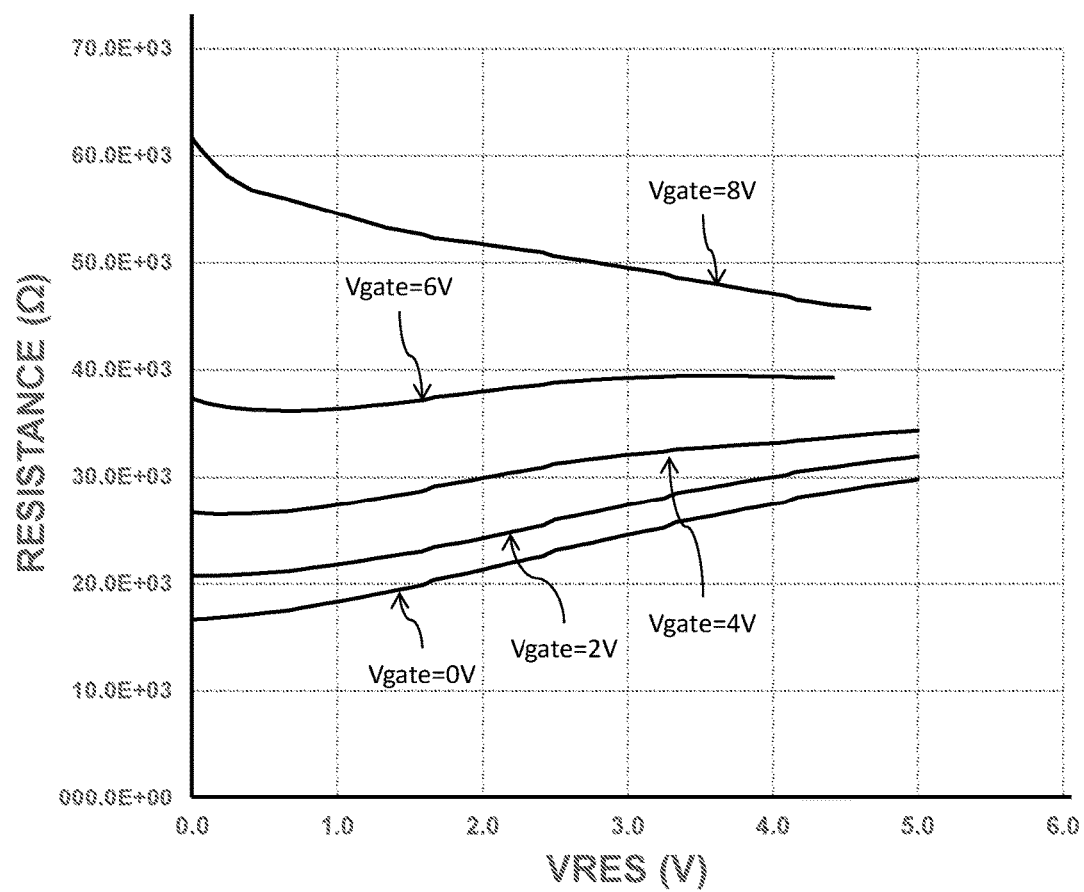

FIG. 6 is a graph showing resistance of the variable resistive region as function of voltage difference (VRES) between the first and second terminals of the variable quench resistor $VR_Q$ for a variety of control signal 130 voltages (Vgate).

Figure 7:
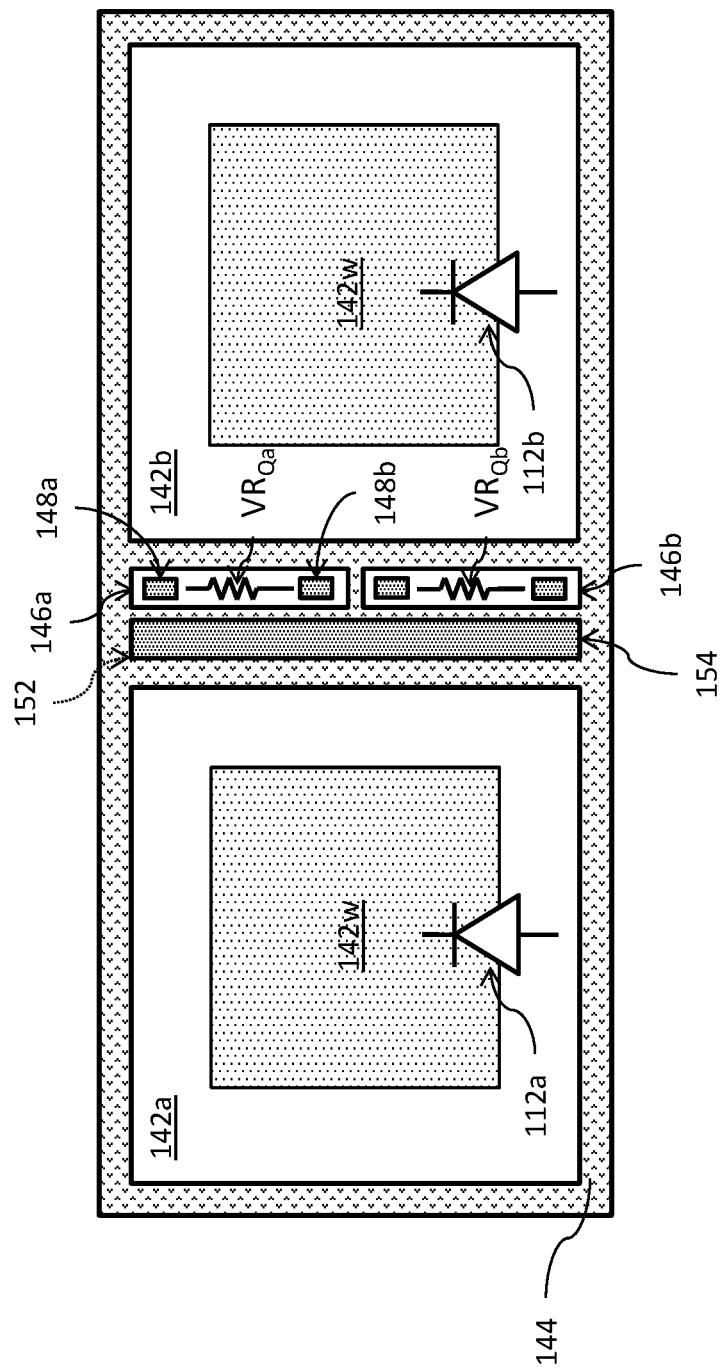
FIG. 7 is a plan view of an example layout of a pair of variable quench resistors and pair of photosensitive diodes which share a control gate.

Reference is now made to FIG. 7 showing a plan view of an example layout of a pair of variable quench resistors and pair of photosensitive diodes which share a control gate. A first photosensitive diode 112a is formed by a region 142a of semiconductor material of a semiconductor substrate that is surrounded by an insulating wall 144. A second photosensitive diode 112b is formed by a region 142b of semiconductor material of the semiconductor substrate that is surrounded by the insulating wall 144. Each region 142a and 142b includes the necessary structures (for example, doped regions) to form the anode and cathode of the photosensitive diode 112a or 112b. Specific details of all structures related to the photosensitive diodes 112a and 112b are not provided as such details are well known to those skilled in the art. As a simplified example, however, each region 142a and 142b may, for example, comprise a portion of a semiconductor substrate that is doped with a first conductivity type (for example, p-type) dopant forming the anode. A well region 142w is located within each region 142a and 142b that is doped with a second conductivity type (for example, n-type) dopant to form the cathode.

A first region 146a of semiconductor material that is surrounded by the insulating wall 144 may, for example, comprise a portion of the semiconductor substrate that is relatively lightly doped with the first conductivity type (p-type) dopant. A second region 146b of semiconductor material that is surrounded by the insulating wall 144 may, for example, comprise a portion of the semiconductor substrate that is relatively lightly doped with the first conductivity type (p-type) dopant. Each region 146a and 146b is rectangular in shape having a length and a width (wherein the width is smaller than the length). At a first end of each rectangular region 146a and 146b, a well region 148a is located at the upper surface of the substrate that provides a contact to a first terminal of a variable quench resistor $R_Q$. At a second end of each rectangular region 146a and 146b, opposite the first end, a well region 148b is located at the upper surface of the substrate that provides a contact to a second terminal of the variable quench resistor $R_Q$. The well regions 148a and 148b are separated from each other by a portion of the region 146a or 146b which forms the variable resistive region of the variable quench resistor $R_Q$. The well regions 148a and 148b are relatively heavily doped with the first conductivity type (p-type) dopant. As an example, the relatively lightly doped region 146 may have a dopant concentration on the order of $10^{16}$ to $10^{17}$ at/cm$^3$ while the relatively heavily doped well regions 148a and 148b may have a dopant concentration on the order of $10^{19}$ to $10^{20}$ at/cm$^3$.

The first terminal provided by the well region 148a within the first region 146a for a first variable quench resistor $VR_{Qa}$ is electrically coupled to the cathode of the first photosensitive diode 112a. Similarly, the first terminal provided by the well region 148a within the second region 146b for a second variable quench resistor $VR_{Qb}$ is electrically coupled to the cathode of the second photosensitive diode 112b. The second terminals provided by the well regions 148b within each of the first region 146a and second region 146b may be connected to the breakdown voltage node ($V_{BD}$).

A region 152 of semiconductor material that is surrounded by the insulating wall 144 may, for example, comprise a portion of the semiconductor substrate that is relatively lightly doped with the first conductivity type (p-type) dopant. See, also, FIG. 4B. The region 152 is rectangular in shape and extends parallel to both of the regions 146a and 146b and may, for example, have a length that is about as long as the combined lengths of the regions 146a and 146b. The region 152 is positioned between the regions 146a and 146 and the region 142a or 142b of one of the photosensitive diodes 112. A well region 154 is located at the upper surface of the substrate within the region 152. In an embodiment, the well region 154 is rectangular in shape and has length and width dimensions matching the length and width dimensions of the region 152. The well region 154 forms a control gate having a terminal that is connected to receive the control signal 130. As an example, the relatively lightly doped region 152 may have a dopant concentration on the order of $10^{16}$ to $10^{17}$ at/cm$^3$ while the relatively heavily doped well region 154 may have a dopant concentration on the order of $10^{19}$ to $10^{20}$ at/cm$^3$.

The well regions 148a, 148b and 154 may all have a same or similar depth which is only a small fraction of the thickness of the semiconductor substrate.

The insulating wall 144 may, for example, comprise a deep trench isolation (DTI) structure as known to those skilled in the art and have a depth that is equal to the thickness of the semiconductor substrate.

The cross-sectional diagrams of FIGS. 4A and 4B are generally equally applicable to show the structure of the variable quench resistor and control gate of the FIG. 7 embodiment.

Although FIG. 7 shows that the control gate is provided on only one side of each region 146a and 146b, it will be understood that an alternative embodiment may provide a control gate on both sides of the regions 146a and 146b as generally shown by FIGS. 3 and 4B.

As noted above, the well regions 148a and 148b form terminal contacts for the variable quench resistor $VR_Q$, and those well regions 148a and 148b are separated from each other by a portion of the region 146a or 146b which forms the variable resistive region of the corresponding variable quench resistor $VR_{Qa}$ or variable quench resistor $VR_{Qb}$. Current flow between the well regions 148a and 148b in a direction generally parallel to the upper surface of the substrate is controlled by the voltage of the control signal 130 applied to the well region 154 which functions as a control gate for both variable quench resistors. In this configuration, the portion of the region 146 between the well regions 148a and 148b forms a channel whose conductivity is modulated by the control signal 130 voltage (Vgate) applied to the control gate well region 154.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

The invention claimed is:

1. An integrated circuit, comprising:
  a photosensitive diode having an anode terminal and a cathode terminal;
  a passive quench resistor having a first terminal connected to the cathode terminal and second terminal connected to a supply node configured to receive a supply voltage sufficient to reverse bias the photosensitive diode to function as a single photon avalanche diode (SPAD);
  wherein the passive quench resistor is formed by:
    a first semiconductor region of a semiconductor substrate that is relatively lightly doped with a first conductivity type dopant;
    a first well region at an upper surface of the semiconductor substrate within the first semiconductor region that is relatively heavily doped with the first conductivity type dopant to form the first terminal of the passive quench resistor; and
    a second well region at the upper surface of the semiconductor substrate within the first semiconductor region that is relatively heavily doped with the first conductivity type dopant to form the second terminal of the passive quench resistor; and
  a control gate configured to receive a control signal having a voltage which controls a resistivity of the passive quench resistor;
  wherein the control gate is formed by:
    a second semiconductor region of the semiconductor substrate that is relatively lightly doped with the first conductivity type dopant, said second semiconductor region insulated from the first semiconductor region and extending parallel to the first semiconductor region; and a third well region at an upper surface of the semiconductor substrate within the second semiconductor region that is relatively heavily doped with the first conductivity type dopant to form the control gate.

2. The integrated circuit of claim 1, further comprising a deep trench isolation structure that surrounds the photosensitive diode, surrounds the first semiconductor region and surrounds the second semiconductor region.

3. The integrated circuit of claim 1, wherein the photosensitive diode includes a first region doped with the first conductivity type dopant and a second region doped with a second conductivity type dopant opposite to the first conductivity type dopant.

4. The integrated circuit of claim 1, wherein the first semiconductor region is a rectangular region having a width and a length, wherein the second semiconductor region is a rectangular region having a width and a length, and wherein the length of the rectangular region for the first semiconductor region extends parallel to the length of the rectangular region for the second semiconductor region.

5. The integrated circuit of claim 4, wherein the lengths of the rectangular regions for the first and second semiconductor regions are the same.

6. The integrated circuit of claim 1, wherein the first and second well regions have a first depth and wherein the third well region has a second depth.

7. The integrated circuit of claim 6, wherein the first and second depths are the same.

8. An integrated circuit, comprising:
a semiconductor substrate that is relatively lightly doped with a first conductivity type dopant;
an insulating wall that delimits, within the semiconductor substrate, a first semiconductor region, a second semiconductor region and a third semiconductor region, wherein the first, second and third semiconductor regions are insulated from each other by said insulating wall;
a first well within the first semiconductor region that is doped with a second conductivity type dopant and configured to form a first photosensitive diode;
a second well at an upper surface of the semiconductor substrate within the second semiconductor region that is relatively heavily doped with the first conductivity type dopant to form a first terminal;
a third well at an upper surface of the semiconductor substrate within the second semiconductor region that is relatively heavily doped with the first conductivity type dopant to form a second terminal;
wherein the third well is separated from the second well by a portion of the second semiconductor region to form a first quench resistor that is electrically connected to the first photosensitive diode through one of the first and second terminals; and
a fourth well at an upper surface of the semiconductor substrate within the third semiconductor region that is relatively heavily doped with the first conductivity type dopant to form a first gate terminal configured to modulate a resistance of the first quench resistor.

9. The integrated circuit of claim 8, wherein the second semiconductor region is a rectangular region having a width and a length, wherein the third semiconductor region is a rectangular region having a width and a length, and wherein the length of the rectangular region for the second semiconductor region extends parallel to the length of the rectangular region for the third semiconductor region.

10. The integrated circuit of claim 9, wherein the lengths of the rectangular regions for the second and third semiconductor regions are the same.

11. The integrated circuit of claim 9, wherein the length of the rectangular region for the third semiconductor region is larger than the length of the rectangular region for the second semiconductor region.

12. The integrated circuit of claim 8, wherein the insulating wall further delimits, within the semiconductor substrate, a fourth semiconductor region, the first, second, third and fourth semiconductor regions being insulated from each other by said insulating wall, and further comprising a fifth well at an upper surface of the semiconductor substrate within the fourth semiconductor region that is relatively heavily doped with the first conductivity type dopant to form a second gate terminal configured to modulate the resistance of the first quench resistor.

13. The integrated circuit of claim 12, wherein the first and second gate terminals are electrically connected to each other.

14. The integrated circuit of claim 12, wherein the third semiconductor region for the first gate terminal is positioned on one side of the second semiconductor region and the fourth semiconductor region for the second gate terminal is positioned on another side of the second semiconductor region, said another side being opposite said one side.

15. The integrated circuit of claim 8, wherein the insulating wall further delimits, within the semiconductor substrate, a fifth semiconductor region, the first, second, third and fifth semiconductor regions being insulated from each other by said insulating wall, and further comprising:
a fourth well at an upper surface of the semiconductor substrate within the fifth semiconductor region that is relatively heavily doped with the first conductivity type dopant to form a third terminal;
a fifth well at an upper surface of the semiconductor substrate within the fifth semiconductor region that is relatively heavily doped with the first conductivity type dopant to form a fourth terminal;
wherein the fourth well is separated from the fifth well by a portion of the fifth semiconductor region to form a second quench resistor.

16. The integrated circuit of claim 15, wherein the first gate terminal is further configured to modulate a resistance of the second quench resistor.

17. The integrated circuit of claim 16, wherein the second semiconductor region is a rectangular region having a width and a length, wherein the third semiconductor region is a rectangular region having a width and a length, wherein the fifth semiconductor region is a rectangular region having a width and a length, and wherein the length of the rectangular region for the second semiconductor region and the length of the rectangular region for the fifth semiconductor region both extend parallel to the length of the rectangular region for the third semiconductor region.

18. The integrated circuit of claim 17, wherein the lengths of the rectangular regions for the third and fifth semiconductor regions are the same.

19. The integrated circuit of claim 17, wherein the length of the rectangular region for the third semiconductor region is larger than the length of the rectangular region for the second semiconductor region and further is larger than the length of the rectangular region for the fifth semiconductor region.

20. The integrated circuit of claim 15, wherein the insulating wall further delimits, within the semiconductor substrate, a sixth semiconductor region, the first, second, third, fifth and sixth semiconductor regions being insulated from each other by said insulating wall, and further comprising a sixth well within the sixth semiconductor region that is doped with the second conductivity type dopant and configured to form a second photosensitive diode, wherein the second quench resistor is electrically connected to the second photosensitive diode through one of the third and fourth terminals.

21. An integrated circuit, comprising:
a photosensitive diode having an anode terminal and a cathode terminal; and
a passive quench resistance circuit having a variable resistance controlled by a control signal;
wherein said passive quench resistance circuit comprises:
a first semiconductor region of a semiconductor substrate that is doped with a first conductivity type dopant at a first concentration level and including a first resistor terminal and a second resistor terminal, the first and second resistor terminals separated from each other by a portion of the first semiconductor region forming a resistor;
wherein one of the first and second resistor terminals is electrically connected to the cathode terminal of the photosensitive diode; and
a second semiconductor region of the semiconductor substrate that is doped with the first conductivity type dopant at a second concentration level higher than the first concentration level, said second semiconductor region insulated from the first semiconductor region and extending parallel to the first semiconductor region to form a control gate configured to receive said control signal with a voltage that controls said variable resistance.

22. The circuit of claim 21, further comprising a deep trench isolation structure that surrounds the photosensitive diode, surrounds the first semiconductor region and surrounds the second semiconductor region.

23. The circuit of claim 21, wherein the photosensitive diode includes a first region doped with the first conductivity type dopant and a second region doped with a second conductivity type dopant opposite to the first conductivity type dopant.

24. The circuit of claim 21, wherein the first semiconductor region is a rectangular region having a width and a length, wherein the second semiconductor region is a rectangular region having a width and a length, and wherein the length of the rectangular region for the first semiconductor region extends parallel to the length of the rectangular region for the second semiconductor region.

25. The circuit of claim 24, wherein the lengths of the rectangular regions for the first and second semiconductor regions are the same.

26. An integrated circuit, comprising:
a photosensitive diode having an anode terminal and a cathode terminal; and
a passive quench resistance circuit having a variable resistance controlled by a control signal;
wherein said passive quench resistance circuit comprises:
a semiconductor region of a semiconductor substrate that is doped with a first conductivity type dopant at a first concentration level and including a first resistor terminal and a second resistor terminal, the first and second resistor terminals separated from each other by a portion of the first semiconductor region forming a resistor;
wherein one of the first and second resistor terminals is electrically connected to the cathode terminal of the photosensitive diode; and
a conductive deep trench isolation structure insulated from the first semiconductor region and extending parallel to the first semiconductor region to form a control gate configured to receive said control signal with a voltage that controls said variable resistance.

27. The circuit of claim 26, further comprising an insulating deep trench isolation structure that surrounds the photosensitive diode.

28. The circuit of claim 26, wherein the semiconductor region is a rectangular region having a width and a length, wherein the conductive deep trench isolation structure is a rectangular region having a width and a length, and wherein the length of the rectangular region for the semiconductor region extends parallel to the length of the rectangular region for the conductive deep trench isolation structure.

29. The circuit of claim 28, wherein the lengths of the rectangular regions for the semiconductor region and the conductive deep trench isolation structure are the same.

* * * * *